United States Patent
Mao et al.

(10) Patent No.: US 9,440,376 B2
(45) Date of Patent: Sep. 13, 2016

(54) METHODS OF FORMING MOLDS AND METHODS OF FORMING ARTICLES USING SAID MOLDS

(75) Inventors: Guoping Mao, Woodbury, MN (US); Moses M. David, Woodbury, MN (US); Olester Benson, Jr., Woodbury, MN (US); Robert J. DeVoe, Arden Hills, MN (US); Jennifer J. Sahlin, Minneapolis, MN (US)

(73) Assignee: 3M Innovative Properties Company, St. Paul, MN (US)

(*) Notice: Subject to any disclaimer, the term of this patent is extended or adjusted under 35 U.S.C. 154(b) by 1108 days.

(21) Appl. No.: 12/675,570

(22) PCT Filed: Sep. 5, 2008

(86) PCT No.: PCT/US2008/075412
§ 371 (c)(1),
(2), (4) Date: Feb. 26, 2010

(87) PCT Pub. No.: WO2009/033029
PCT Pub. Date: Mar. 12, 2009

(65) Prior Publication Data
US 2010/0239783 A1   Sep. 23, 2010

Related U.S. Application Data

(60) Provisional application No. 60/967,632, filed on Sep. 6, 2007.

(51) Int. Cl.
*H05H 1/24* (2006.01)
*B29C 33/58* (2006.01)
(Continued)

(52) U.S. Cl.
CPC ............. *B29C 33/58* (2013.01); *C23C 16/401* (2013.01); *G02B 1/118* (2013.01); *B29C 33/3857* (2013.01); *B29C 33/405* (2013.01); *B29K 2083/005* (2013.01); *B29K 2105/0082* (2013.01)

(58) Field of Classification Search
CPC . B29C 33/58; B29C 33/405; B29C 33/3857; B29K 2083/005; B29K 2105/0082; C23C 16/401; G02B 1/118
USPC ........................................................ 427/578
See application file for complete search history.

(56) References Cited

U.S. PATENT DOCUMENTS

| 3,018,262 A | 1/1962 | Schroeder |
| 3,729,313 A | 4/1973 | Smith |

(Continued)

FOREIGN PATENT DOCUMENTS

| EP | 0841140 | 5/1998 |
| EP | 0856592 | 8/1998 |

(Continued)

OTHER PUBLICATIONS http://www.elmhurst.edu/~chm/vchembook/501hcboilingpoints.html "Hydrocarbon boiling points" accessed Jun. 26, 2013.*

(Continued)

*Primary Examiner* — Michael Cleveland
*Assistant Examiner* — Michael G Miller
(74) *Attorney, Agent, or Firm* — Qiang Han

(57) ABSTRACT

A method of forming a working mold including placing a substrate near an electrode in a chamber, the substrate (610) having at least a first structured surface (620); providing power to the electrode to create a plasma, —introducing vapor of liquid silicone molecules into the plasma; and depositing a release layer (630), the release layer (630) including a silicone containing polymer, the release layer (630) being deposited on at least a portion of the first structured surface of the substrate to form the working mold.

16 Claims, 4 Drawing Sheets

(51) Int. Cl.
  *C23C 16/40* (2006.01)
  *G02B 1/118* (2015.01)
  *B29C 33/38* (2006.01)
  *B29C 33/40* (2006.01)
  *B29K 83/00* (2006.01)
  *B29K 105/00* (2006.01)

(56) References Cited

U.S. PATENT DOCUMENTS

| | | |
|---|---|---|
| 3,741,769 A | 6/1973 | Smith |
| 3,779,778 A | 12/1973 | Smith |
| 3,808,006 A | 4/1974 | Smith |
| 3,935,292 A * | 1/1976 | Okubo .................... B29C 33/64 106/38.22 |
| 4,249,011 A | 2/1981 | Wendling |
| 4,250,053 A | 2/1981 | Smith |
| 4,262,072 A | 4/1981 | Wendling |
| 4,279,717 A | 7/1981 | Eckberg |
| 4,394,403 A | 7/1983 | Smith |
| 4,491,628 A | 1/1985 | Ito |
| 4,642,126 A | 2/1987 | Zador |
| 4,652,274 A | 3/1987 | Boettcher |
| 4,668,601 A | 5/1987 | Kistner |
| 4,828,778 A * | 5/1989 | Gelsomini et al. .......... 264/167 |
| 4,859,572 A | 8/1989 | Farid |
| 5,148,010 A | 9/1992 | Mori |
| 5,235,015 A | 8/1993 | Ali |
| 5,298,741 A | 3/1994 | Walt |
| 5,369,511 A | 11/1994 | Amos |
| 5,384,238 A | 1/1995 | Ellis |
| 5,512,219 A | 4/1996 | Rowland |
| 5,545,676 A | 8/1996 | Palazzotto |
| 5,718,497 A | 2/1998 | Yokoyama |
| 5,753,346 A | 5/1998 | Leir |
| 5,770,737 A | 6/1998 | Reinhardt |
| 5,856,373 A | 1/1999 | Kaisaki |
| 5,858,624 A | 1/1999 | Chou |
| 5,859,251 A | 1/1999 | Reinhardt |
| 5,998,495 A | 12/1999 | Oxman |
| 6,025,406 A | 2/2000 | Oxman |
| 6,100,405 A | 8/2000 | Reinhardt |
| 6,215,095 B1 | 4/2001 | Partanen |
| 6,262,140 B1 | 7/2001 | Savant |
| 6,288,842 B1 | 9/2001 | Florczak |
| 6,316,153 B1 | 11/2001 | Goodman |
| 6,560,248 B1 | 5/2003 | Vernackt |
| 6,565,776 B1 * | 5/2003 | Li et al. .................... 264/2.5 |
| 6,674,572 B1 | 1/2004 | Scheruebl |
| 6,696,157 B1 | 2/2004 | David |
| 6,713,772 B2 | 3/2004 | Goodman |
| 6,750,266 B2 | 6/2004 | Bentsen |
| 6,804,062 B2 | 10/2004 | Atwater |
| 6,852,766 B1 | 2/2005 | DeVoe |
| 6,855,478 B2 | 2/2005 | DeVoe |
| 6,887,420 B2 | 5/2005 | Heilig |
| 6,949,272 B2 | 9/2005 | Wochnowski |
| 7,026,103 B2 | 4/2006 | DeVoe |
| 7,070,406 B2 | 7/2006 | Jeans |
| 7,157,145 B2 | 1/2007 | Vissing |
| 7,374,417 B2 | 5/2008 | Kuwabara |
| 7,551,359 B2 | 6/2009 | Murnan |
| 7,563,013 B2 | 7/2009 | Lin |
| 7,583,444 B1 | 9/2009 | DeVoe |
| 7,887,889 B2 | 2/2011 | David |
| 7,893,410 B2 | 2/2011 | Sykora |
| 8,109,665 B2 | 2/2012 | Lin |
| 2002/0163619 A1 | 11/2002 | Matsuzawa |
| 2002/0192569 A1 | 12/2002 | Ulland |
| 2002/0197051 A1 | 12/2002 | Tamura |
| 2003/0006535 A1 | 1/2003 | Hennessey |
| 2003/0071016 A1 | 4/2003 | Shih |
| 2003/0139484 A1 | 7/2003 | Bentsen |
| 2003/0155667 A1 | 8/2003 | Devoe |
| 2003/0175525 A1 * | 9/2003 | Wochnowski et al. .... 428/423.1 |
| 2004/0067431 A1 | 4/2004 | Arney |
| 2004/0145915 A1 | 7/2004 | Kim |
| 2004/0180210 A1 | 9/2004 | Vissing |
| 2004/0182820 A1 * | 9/2004 | Motowaki et al. ............. 216/44 |
| 2004/0202865 A1 | 10/2004 | Homola |
| 2004/0223385 A1 | 11/2004 | Fleming |
| 2004/0228112 A1 | 11/2004 | Takata |
| 2005/0054744 A1 | 3/2005 | DeVoe |
| 2005/0079295 A1 | 4/2005 | Schaepkens |
| 2005/0120747 A1 * | 6/2005 | Fujimoto ........................ 65/29.1 |
| 2005/0133954 A1 | 6/2005 | Homola |
| 2005/0147918 A1 | 7/2005 | Weber |
| 2005/0167894 A1 | 8/2005 | Shih |
| 2005/0254035 A1 | 11/2005 | Frankel |
| 2005/0271794 A1 | 12/2005 | DeSimone |
| 2005/0272599 A1 | 12/2005 | Kramer |
| 2005/0273146 A1 | 12/2005 | DeSimone |
| 2005/0287771 A1 | 12/2005 | Seamons |
| 2006/0046156 A1 | 3/2006 | Amako |
| 2006/0051048 A1 | 3/2006 | Gardiner |
| 2006/0079600 A1 * | 4/2006 | Gopalratnam et al. ........ 523/139 |
| 2006/0157444 A1 | 7/2006 | Nakamura |
| 2006/0226566 A1 | 10/2006 | Kwak |
| 2006/0231728 A1 | 10/2006 | Takamatsu |
| 2006/0254894 A1 | 11/2006 | Jung |
| 2006/0279025 A1 | 12/2006 | Heidari |
| 2007/0018362 A1 | 1/2007 | Heidari |
| 2007/0035843 A1 | 2/2007 | Cassarly |
| 2007/0057031 A1 | 3/2007 | Lee |
| 2007/0090278 A1 | 4/2007 | Botma |
| 2007/0102844 A1 | 5/2007 | Simon |
| 2007/0216049 A1 | 9/2007 | Rudmann |
| 2007/0217181 A1 | 9/2007 | Chiu |
| 2007/0264481 A1 | 11/2007 | DeSimone |
| 2007/0271791 A1 | 11/2007 | Lai |
| 2008/0007964 A1 | 1/2008 | Lin |
| 2008/0083886 A1 | 4/2008 | Faklis |
| 2008/0106001 A1 | 5/2008 | Slafer |
| 2008/0196664 A1 | 8/2008 | David |
| 2008/0319404 A1 | 12/2008 | Pekurovsky |
| 2009/0061039 A1 | 3/2009 | Zhang |
| 2009/0099537 A1 | 4/2009 | DeVoe |
| 2009/0163127 A1 | 6/2009 | David |
| 2009/0175050 A1 | 7/2009 | Marttila |
| 2009/0213466 A1 | 8/2009 | Murnan |
| 2009/0250635 A1 | 10/2009 | Sykora |
| 2009/0279321 A1 | 11/2009 | Marttila |
| 2009/0284840 A1 | 11/2009 | DeVoe |
| 2009/0285543 A1 | 11/2009 | Marttila |
| 2010/0227272 A1 | 9/2010 | DeVoe |
| 2010/0288614 A1 | 11/2010 | Ender |
| 2010/0294954 A1 | 11/2010 | Gates |
| 2010/0296106 A1 | 11/2010 | Gates |
| 2010/0308497 A1 | 12/2010 | David |
| 2010/0308509 A1 | 12/2010 | David |
| 2010/0316959 A1 | 12/2010 | Gates |
| 2011/0001950 A1 | 1/2011 | DeVoe |
| 2011/0090142 A1 | 4/2011 | You |

FOREIGN PATENT DOCUMENTS

| | | |
|---|---|---|
| JP | 52-0822957 | 7/1977 |
| JP | 57-173160 | 10/1982 |
| JP | 60-160017 | 8/1985 |
| JP | 61-027212 | 2/1986 |
| JP | 02-022014 | 1/1990 |
| JP | 03-262608 | 11/1991 |
| JP | 10-034668 | 2/1998 |
| JP | 11-024081 | 1/1999 |
| JP | 2001-88138 | 4/2001 |
| JP | 2001-150451 | 6/2001 |
| JP | 2002-210860 | 7/2002 |
| JP | 2003-181843 | 7/2003 |
| JP | 2004-358969 | 12/2004 |
| JP | 2005-041164 | 2/2005 |
| JP | 2005-512839 | 5/2005 |
| JP | 2005-515617 | 5/2005 |
| KR | EP 0841140 A2 * | 5/1998 .......... B29C 33/56 |
| KR | 10-2002-0088146 | 11/2002 |
| KR | 10-2007-0068852 | 7/2007 |

(56) References Cited

FOREIGN PATENT DOCUMENTS

| | | |
|---|---|---|
| WO | WO 98/21521 | 5/1998 |
| WO | WO 99/53242 | 10/1999 |
| WO | WO 01/21374 | 3/2001 |
| WO | WO 01/96915 | 12/2001 |
| WO | WO 01/96952 | 12/2001 |
| WO | WO 01/96958 | 12/2001 |
| WO | WO 01/96961 | 12/2001 |
| WO | WO 02/05972 | 1/2002 |
| WO | WO 03/002269 | 1/2003 |
| WO | WO 2005/101466 | 10/2005 |
| WO | WO 2006/071914 | 7/2006 |
| WO | WO 2006/093963 | 9/2006 |
| WO | WO 2007/051803 | 5/2007 |
| WO | WO 2007/073482 | 6/2007 |
| WO | WO 2007/137102 | 11/2007 |

OTHER PUBLICATIONS

"Techincal Synopsis of Plasma Surface Treatments", Wesley Taylor, University of Gainesville; Accessed online Jun. 11, 2014.*

Polycarbonate, definition from Wikipedia, http://en.wikipedia.org/wiki/Polycarbonate, obtained from the Internet, Jun. 1, 2012, 1 page.

Polycarbonates thermoplastic thermoset, http://www.pslc.ws/macrog/pc.htm, obtained from Internet on Jun. 3, 2012, 4 pages.

Poly(methyl methacrylate), definition from Wikipedia, http://en.wikipedia.org/wiki/Poly(methyl_methacrylate), obtained from the Internet, Jun. 1, 2012, 1 page.

Allen, "193 nm Single Layer Positive Resists Building Etch Resistance into a High Resolution Imaging System", SPIE, 1995, vol. 2438, pp. 474-485.

Allen, "High Performance Acrylic Polymers for Chemically Amplified Photoresist Applications", J. Vac. Sci. Tech. B, Nov./Dec. 1991, vol. 9, No. 6, pp. 3357-3361.

Beringer, "Diaryliodonium Salts. IX. The Synthesis of Substituted Diphenyliodonium Salts", J. Am. Chem. Soc., 1959, vol. 81, pp. 342-351.

Chang, "A Roller Embossing Process for Rapid Fabrication of Microlens Arrays on Glass Substrates", Microsyst. Technol., Feb. 2006, vol. 12, pp. 754-759.

Eaton, "Dye Sensitized Photopolymerization", Advances in Photochemistry, 1986, vol. 13, pp. 427-487.

Korner, "New Approaches in Depth-scanning Optical Metrology", Proc. of SPIE, Apr. 1, 2004, vol. 5457, pp. 320-333, XP009084995.

Large, "The Use of Electrochemical Potential Data in Studies of Spectral Sensitization", Photographic Sensitivity, R.J. Cox, ed., Academic Press, Inc., Chapter 15, pp. 241-263, (1973).

Lee, Handbook of Epoxy Resins, McGraw-Hill, Inc. (1967).

Lel, "Local Thickness and Wave Velocity Measurement of Wavy Films with a Chromatic Confocal Imaging Method and a Fluorescence Intensity Technique", Experiments in Fluids, Nov. 1, 2005, vol. 39, pp. 856-864.

Li, "Multiphoton Polymerization", Materials Today, Jun. 2007, vol. 10, No. 6, pp. 30-37.

Mann, Electrochemical Reactions in Nonaqueous Systems, Marcel Dekker, Inc., (1970).

Peng, "High Fidelity Fabrication of Microlens Arrays by Nanoimprint Using Conformal Mold Duplication and Low-pressure Liquid Material Curing", J. Vac. Sci. Technol. B, Mar./Apr. 2007, vol. 25, No. 2, pp. 410-414.

Shi, "Chromatic Confocal Microscopy Using Supercontinuum Light", Optics Express, May 17, 2004, vol. 12, No. 10, pp. 2096-2101.

Weinberg, Techniques of Chemistry, vol. 5, Part II, Technique of Electroorganic Synthesis, John Wiley & Sons, Inc., (1975).

Xu, "Measurement of Two-photon Excitation Cross Sections of Molecular Fluorophores with Data from 690 to 1050 nm", J. Opt. Soc. Am. B, Mar. 1996, vol. 13, No. 3, pp. 481-491.

Zhou, "An Efficient Two-Photon-Generated Photoacid Applied to Positive-tone 3D Microfabrication", Science, May 10, 2002, vol. 296, pp. 1106-1109.

"Microlenslet Array Based Magnifying System," Shaoulov, Breault Research Organization, Inc., Tucson, AZ, USA, [on line], [retrieved from the internet on Feb. 7, 2011], URL <www.breault.com/resources/kbasePDF/wp_spie_026_microlenslet_array.pdf>, 8 pages. (date unknown but believed to be prior to the date of filing of the priority application).

Anderson, "Close-up Imaging of Documents and Displays with Lens Arrays", Appl. Opt., Feb. 15, 1979, vol. 18, No. 4, pp. 477-484.

Baldacchini and Fourkas, "Fabrication and Metallization of Three-dimensional Microstructures", Materials Research Society Symposium Proceedings, 2004, vol. EXS-2, pp. M10.1.1-M10.1.3.

Beck, "Improving Stamps for 10 nm Level Wafer Scale Nanoimprint Lithography", Microelectr. Eng., 2002, vol. 61-62, pp. 441-448.

Bongiovanni, "UV-curable Systems Containing Perfluoropolyether Structures: Synthesis and Characterization", Macromol. Chem. Phys., 1997, vol. 198, pp. 1893-1907.

Braun, "Polymer Replication of 3D Microstructures Employing a High Content Fluorine Separation Layer", Appl. Surf. Sci., 1999, vol. 138-139, pp. 206-211.

Dentinger, "Removal of SU-8 Photoresist for Thick Film Applications", Microelectronic Engineering, 2002, vol. 61-62, pp. 993-1000.

Duparre, "Artificial Compound Eyes—Different Concepts and Their Application to Ultra Flat Image Acquisition Sensors", MOEMS and Miniaturized Systems IV; Proceedings of SPIE, 2004, vol. 5346, pp. 89-100.

Duparre, "Microoptical Telescope Compound Eye", Optics Express, Feb. 7, 2005, vol. 13, No. 3, pp. 889-903.

Groning, "'Self-thickness-limited' Plasma Polymerization of an Ultrathin Antiadhesive Film", J. Vac. Sci. Tech. A., Nov./Dec. 1996, vol. 14, No. 6, pp. 3043-3048.

Hembd-Solner, "Imaging Properties of the Gabor Superlens", J. Opt. A: Pure Appl. Opt., 1999, vol. 1, pp. 94-102.

Hinsberg, "Effect of Resist Components on Image Spreading During Postexposure Bake of Chemically Amplified Resists", Advances in Resist Technology and Processing XVII; Proceedings of SPIE, 2000, vol. 3999, pp. 148-160.

Houle, "Antiadhesion Considerations for UV Nanoimprint Lithography", Applied Physics Letters, 2007, vol. 90, No. 213103, pp. 213103-1-213103-3.

Jaszewski, "Properties of Thin Anti-adhesive Films Used for the Replication of Microstructures in Polymers", Microelectr. Eng., 1997, vol. 35, pp. 381-384.

Jung, "Vapor-phase Self-assembled Monolayer for Improved Mold Release in Nanoimprint Lithography", Langmuir, 2005, vol. 21, pp. 1158-1161.

Kim, "A Simple Fabrication Route to a Highly Transparent Super-hydrophobic Surface with a Poly(dimethylsiloxane) Coated Flexible Mold", Chem. Commun., 2007, pp. 2237-2239.

Lafratta and Fourkas, "Direct Laser Patterning of Conductive Wires on Three-dimensional Polymeric Microstructures", Chem. Mater., 2006, vol. 18, pp. 2038-2042.

Lee, "Antiadhesion Surface Treatments of Molds for High-Resolution Unconventional Lithography", Adv. Mater., 2006, vol. 18, pp. 3115-3119.

Lee, "Self-assembled Monolayer as an Antiadhesion Layer on a Nickel Nanostamper in the Nanoreplication Process for Optoelectronic Applications", Applied Physics Letters, 2006, vol. 88, No. 073101, pp. 073101-1-073101-3.

Maruo, "Three-dimensional Microfabrication with Two-photon-absorbed Photopolymerization," Opt. Lett., Jan. 15, 1997, vol. 22, No. 2, pp. 132-134.

Moon, Ford, and Yang, "Fabricating Three-dimensional Polymeric Photonic Structures by Multi-beam Interference Lithography", Polymers for Advanced Technologies, Feb. 2006, vol. 17, No. 2, pp. 83-93.

(56) References Cited

OTHER PUBLICATIONS

Park, "Fabrication of Nano-precision PDMS Replica Using Two-photon Photopolymerization and Vacuum Pressure Difference Technique", Bull. Korean Chem. Soc., 2004, vol. 25, No. 8, pp. 1119-1120.

Piestrup, "Large Area X-ray and Neutron Imaging Using Three-dimensional Arrays of Microlenses", Rev. of Sci. Inst., Nov. 2004, vol. 75, No. 11, pp. 4769-4774.

Shaoulov, "Compact Microlenslet-array-based Magnifier", Opt. Lett., Apr. 1, 2004, vol. 29, No. 7, pp. 709-711.

Shaoulov, "Magnifying Miniature Displays with Microlenslet Arrays", Helmet- and Head-Mounted Displays IX: Technologies and Applications; Proceedings of SPIE, 2004, vol. 5442, pp. 246-253.

Smith, Modern Optical Engineering: The Design of Optical Systems, 1966, pp. 104-105.

Tanaka, Ishikawa and Kawata, "Two-photon-induced Reduction of Metal Ions for Fabricating Three-dimensional Electrically Conductive Metallic Microstructure", Appl. Phys. Lett., 2006, vol. 88, pp. 81107-1-81107-3.

Wang, "Polybenzoxazine as a Mold-release Agent for Nanoimprint Lithography", Langmuir, 2007, vol. 23, pp. 5868-5871.

International Search Report for PCT/US2008/075412, Filing Date Sep. 5, 2008.

* cited by examiner

METHODS OF FORMING MOLDS AND METHODS OF FORMING ARTICLES USING SAID MOLDS

CROSS REFERENCE TO RELATED APPLICATIONS

This application is a national stage filing under 35 U.S.C. §371 of PCT/US2008/075412, filed Sep. 5, 2008, which claims priority to U.S. Provisional Application No. 60/967,632, filed Sep. 6, 2007, the disclosure of which is incorporated by reference in its/their entirety herein.

FIELD

The present disclosure relates to methods of forming and utilizing molds.

BACKGROUND

Molds and molding processes have been extensively used and studied. The machine tool industry is capable of creating molds having a wide variety of detailed and useful patterns. Until recently molds were generally made from metal. Machining a metal mold to a customer's specifications can be a very time consuming process. The extensive time involved has lead the industry to investigate polymer molds. Polymer molds, although much quicker to manufacture can suffer from poor durability, poor release characteristics and transfer of material from the mold to the molded article. Polymer molds having better durability, release characteristics and minimal or no transfer of material from the mold are therefore desirable.

BRIEF SUMMARY

Disclosed herein is a method of forming a working mold including placing a substrate on an electrode in a chamber, the substrate having at least a first structured surface; providing power to the electrode to create a plasma; introducing vapor of liquid silicone into the plasma; and depositing a release layer, the release layer including a silicone containing polymer, the release layer being deposited on at least a portion of the first structured surface of the substrate to form the working mold.

Also disclosed is a method of forming a molded article including placing an untreated working mold near an electrode in a chamber, the untreated working mold having at least a first structured surface; providing power to the electrode to create a plasma; introducing vapor of liquid silicone into the plasma; depositing a release layer, the release layer including a silicone containing polymer, the release layer being deposited on at least a portion of the first structured surface of the untreated working mold to form the working mold; and contacting a third generation precursor with at least a portion of the first surface of the working mold to form the molded article that is the inverse of the first structured surface of the working mold.

Also disclosed is a method of continuously forming a molded article including placing an untreated working mold near an electrode in a chamber, the untreated working mold having at least a first structured surface; providing power to the electrode to create a plasma; introducing vapor of liquid silicone into the plasma; depositing a release layer, the release layer including a silicone containing polymer, the release layer being deposited on at least a portion of the first structured surface of the untreated working mold to form the working mold; forming a continuous tool including the working mold; and continuously contacting a third generation precursor with at least a portion of the first surface of the working mold to form a molded article that is the inverse of the first structured surface of the working mold.

Articles made using methods as disclosed and exemplified herein are also disclosed.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
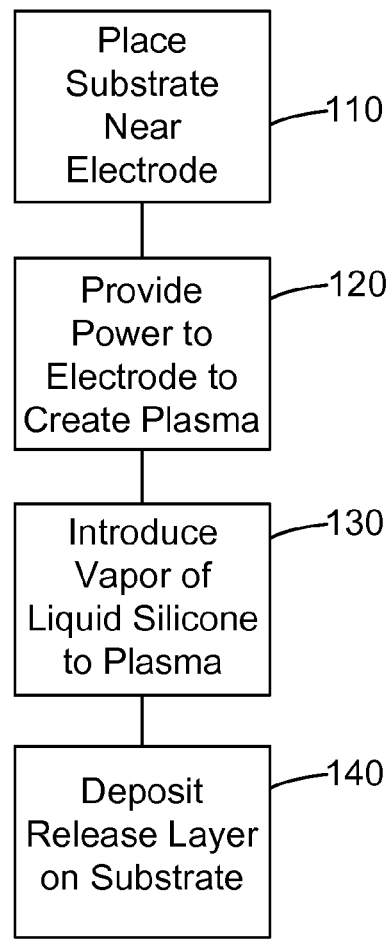
FIG. 1 depicts an embodiment of a method as disclosed herein.

In the following description, reference is made to the accompanying drawings that form a part hereof, and in which are shown by way of illustration several specific embodiments. It is to be understood that other embodiments are contemplated and may be made without departing from the scope or spirit of the present invention. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

As used in this specification, the term "alkyl" refers to a monovalent group that is a radical of an alkane, which is a saturated hydrocarbon. The alkyl can be linear, branched, cyclic, or combinations thereof and typically has 1 to 20 carbon atoms. In some embodiments, the alkyl group contains 1 to 18, 1 to 12, 1 to 10, 1 to 8, 1 to 6, or 1 to 4 carbon atoms. Examples of alkyl groups include, but are not limited to, methyl, ethyl, n-propyl, isopropyl, n-butyl, isobutyl, tert-butyl, n-pentyl, n-hexyl, cyclohexyl, n-heptyl, n-octyl, and ethylhexyl. The term "alkyl" also includes both substituted and unsubstituted groups.

As used in this specification, the term "alkoxy" refers to a monovalent group of formula —OR where R is an alkyl group.

Disclosed herein are methods of forming a working mold. In an embodiment, a method of forming a working mold includes depositing a release layer on at least a portion of a substrate. Generally, chemical vapor deposition processes can be utilized to deposit a release layer on a substrate. In an embodiment, plasma enhanced chemical vapor deposition (PECVD), remote plasma enhanced chemical vapor deposition (RPECVD) or ion-enhanced plasma chemical deposition (IEPCD) can be utilized to deposit a release layer on a substrate. Generally, PECVD processes form a plasma using alternating current (AC) or direct current (DC) discharge between two electrodes, with the space between the two electrodes being filled with a reacting gas or gases from which the release layer is ultimately deposited. Any generally utilized system for carrying out PECVD can be utilized herein.

An exemplary PECVD system includes a chamber, also referred to as a reaction chamber. In an embodiment, the chamber can be evacuable, can have means for generating a plasma throughout at least a portion of the chamber and can be capable of maintaining conditions that produce a plasma. That is, the chamber can provide an environment which allows for the control of various conditions, including, but not limited to pressure, the flow rate of one or more gases, the voltage supplied to the powered electrode, the strength of the electric field, formation of a plasma containing reactive species, intensity of ion bombardment and the rate of deposition of a release layer from the reactive species.

In an embodiment, the chamber can be made of aluminum; aluminum has a low sputter yield, therefore very little contamination will generally occur from the surfaces of the chamber. However, other suitable materials, such as copper, glass or stainless steel, may also be used for the chamber. The chamber can have any suitable volume. In an embodiment, the chamber can have a volume of about 3 feet$^3$. The chamber can have any type of configuration generally utilized. An exemplary PECVD system also includes a powered electrode and a grounded electrode. The two electrodes may be symmetric or asymmetric. In an embodiment one or both electrodes may be cooled, for example, by water. An exemplary, commercially available, system that can be modified to be utilized or can be utilized to coat substrates using methods as disclosed herein includes a Plasmatherm PE 3032 (Plasmatherm, Inc., St. Petersburg, Fla.). Alternatively, a system as described in United States Patent Publication No. 20080196664, entitled "MOISTURE BARRIER COATINGS FOR ORGANIC LIGHT EMITTING DIODE DEVICES", filed on Feb. 21, 2007 (the disclosure of which is incorporated herein by reference) could be utilized to coat substrates using methods as disclosed herein.

An exemplary method as disclosed herein is schematically depicted in FIG. 1. The method includes step 110, placing a substrate near an electrode; step 120 providing power to the electrode to create a plasma; step 130, introducing vapor of liquid silicone into the plasma; and step 140, depositing a release layer on at least a portion of the substrate. One of skill in the art, having read this specification, will understand that other steps (some disclosed herein, some not disclosed herein, or both) can occur before, after, simultaneous with, or in between (or any combination thereof) the steps disclosed in FIG. 1.

The substrate to be coated is placed near an electrode, as depicted in step 110 of FIG. 1. One of skill in the art will understand, having read this specification that placing a substrate near an electrode also includes placing a substrate on an electrode, in contact with an electrode, or in the vicinity of the electrode. Contact of the substrate with an electrode is not necessary and if contact is made with the electrode, it does not need to be maintained. In the case of an elongated article, the substrate optionally may be pulled through the chamber continuously. In an embodiment, the substrate to be coated can be placed on the powered electrode or the grounded electrode. In an embodiment, the substrate to be coated is placed on the powered electrode. In an embodiment where a system having an asymmetric electrode (where the area of the powered electrode is smaller than the grounded electrode so that a large ion sheath appears across the powered electrode) the substrate can be located on the powered electrode, in order to cause ion bombardment of the substrate. Ion bombardment can densify the deposited release layer, thereby improving the hardness and durability of the release layer.

Any substrates desired to be coated can be utilized in methods as disclosed herein. In an embodiment, the substrate is polymeric. The polymeric material used as the substrate can be either a thermoset polymeric material or a thermoplastic polymeric material. A thermoset polymeric material is generally one that has undergone a crosslinking reaction that results in a chemical change and an increase in the hardness of the material. Generally, thermoset polymeric materials are infusible, insoluble and resistant to flow upon heating and do not return to their original chemical state upon cooling. A thermoset polymeric material can be formed from a precursor of a thermoset polymeric material, a material that includes crosslinkable materials. Crosslinkable materials need only be crosslinked to form a thermoset polymeric material. The precursor of the thermoset polymeric material can also be polymerizable. Polymerizable materials need to be polymerized and crosslinked to form a thermoset polymeric material. A thermoplastic polymeric material is generally one that undergoes a physical change upon the application of heat, i.e., the material flows upon bonding and returns to its initial non-flowing state upon cooling. Specific materials that can be utilized as substrates or can be utilized to form substrates are exemplified more fully below.

Generally, substrates that are utilized in methods as disclosed herein and formed using methods disclosed herein can function as a working mold. As used herein, a master mold, or a first generation mold can be utilized to make a working mold (as described below). A working mold can also be referred to herein as a second generation mold or replica of the master mold, which is the first generation mold. A working mold can be used to make a molded article. A molded article can also be referred to as a third generation mold, replica of the second generation mold, or replica of the working mold.

Substrates that are utilized herein can generally have at least one structured surface. The at least one structured surface can generally have a pattern that is the inverse of a pattern or a portion of a pattern that is desired in a molded article. Features that make up the at least one structured surface can generally have dimensions of nanometers to centimeters for example. In an embodiment, features that make up the at least one structured surface can generally have dimensions of nanometers to micrometers.

In an embodiment, features of the working mold can generally have dimensions of about 5 nanometer (nm) to about 1 millimeters. In an embodiment, features of the working mold can generally have dimensions of about 5 nanometers to about 500 micrometers. In an embodiment, features of the working mold can generally have dimensions of about 100 nanometers to about 500 micrometers. In an embodiment, features of the working mold can generally have dimensions of about 50 nanometers to about 200 micrometers. In an embodiment, features of the working mold can generally have dimensions of about 100 nanometers to about 200 micrometers.

In an embodiment, a working mold can have features that can generally have aspect ratios (ratio of the height to the width) that are less than about 10. In an embodiment, a working mold can have features that can generally have aspect ratios that are less than about 5. In an embodiment, a working mold can have features that can generally have aspect ratios that are less than about 3. In an embodiment, a working mold can have features that can generally have aspect ratios that are less than about 2.

Figure 2A:
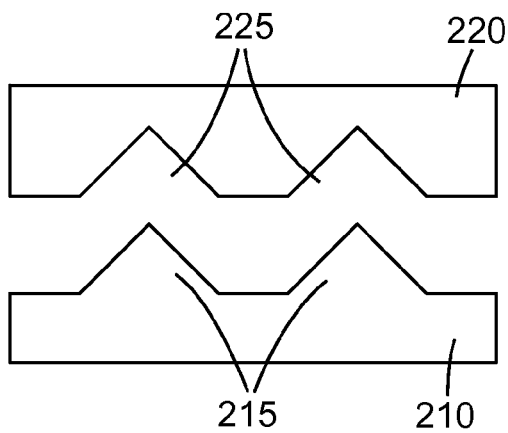
FIGS. 2a and 2b schematically illustrate a relationship between a master mold, a working mold and a molded article.
Figure 2B:
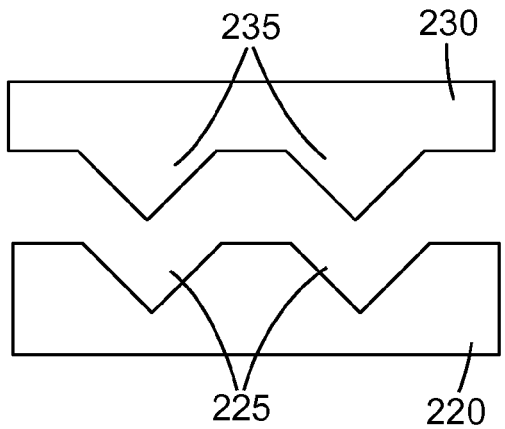

A working mold can be formed using methods and techniques as are generally known to one of skill in the art. One such method includes the use of a master mold or a first generation mold. A master mold can generally have a structured surface that is the inverse of the working mold, or is the same as the pattern or portion of a pattern that is desired to be formed in a molded article. The relationship between a master mold, a working mold, and a molded article is illustrated in FIGS. 2a and 2b. As seen in FIG. 2a, the master mold 210 and a related working mold 220 have patterns that are the inverse of each other. More specifically, the master mold 210 has protrusions 215; and the working mold 220 has corresponding depressions 225. One of skill in the art will understand that the master mold could conversely have depressions and the working mold could have corresponding protrusions. FIG. 2b illustrates the relationship between the working mold 220 and a molded article 230. As seen in FIG. 2b, the working mold 220 has depressions 225 and the molded article 230 has corresponding protrusions 235. One of skill in the art will understand that the working mold could conversely have protrusions and the molded article can have depressions. By comparing the master mold 210 and the molded article 230 (in FIGS. 2a and 2b), it can also be seen that the master mold 210 has substantially the same pattern as the molded article 230.

A master mold can be formed using methods and techniques as are generally known to one of skill in the art. One such method includes initially forming structures, such as a structured array, on a substrate to create a master mold. The structures in the structured array may be designed and arranged using computer aided design and manufacturing (CAD/CAM) software that is known to those of skill in the art. Once the pattern is designed, it can be created in a suitable material by any of a number of processes using commonly utilized techniques, such as, for example, a multiple-photon such as a two-photon exposure process, chemical or mechanical etching, laser ablation, photolithography, stereolithography, micromachining, knurling, cutting, scoring, engraving, diamond turning, and the like. Any process or combination of processes may be used, as long as it can flexibly and controllably provide patterns with structures of a variety of sizes, geometric configurations, surface profiles, or combinations thereof.

The patterns are not generally limited, and may include, for example, protruding structures, recessed structures, continuous and discontinuous grooves, and combinations thereof. The patterns formed by the structures may be regular or irregular, and the individual structures in these patterns may be the same or different in one or more shapes, angles, dimensions or combinations thereof.

The material used to make the master mold can vary widely. In some cases, any material that is sufficiently rigid, flat and stable to allow accurate creation of the structures can be used. In general, a material that is used is one that allows accurate formation and transfer of such structures. Suitable substrate materials include, but are not limited to, metals, silicon, glasses, quartz, ceramic materials, or polymeric materials. In an embodiment where the master mold is formed of a polymeric material, a first generation precursor may be used to form the polymeric material.

Another exemplary method of fabricating a master mold can be found in commonly assigned PCT Publication No. WO 2007137102, entitled PROCESS FOR MAKING LIGHT GUIDES WITH EXTRACTION STRUCTURES AND LIGHT GUIDES PRODUCED THEREBY, filed on May 17, 2007, which is incorporated by reference herein in its entirety.

Once a master mold is formed, it can then be used to form a working mold. Commonly utilized methods for creating working molds from master molds can be utilized herein. The particular method that is used can depend at least in part, on the material that the working mold is made of. In an embodiment where the working mold is to be polymeric, an exemplary method of forming a working mold from a master mold includes contacting a second generation precursor with at least a portion of the master mold. Generally, contacting the second generation precursor with at least a portion of the master mold can function to cover, fill up, or both, at least a portion of the pattern on the master mold. The second generation precursor can then be removed from the master mold by for example, peeling to form a working mold. The working mold will have the reverse image of at least a portion of the pattern on the master mold. The working mold can be, but need not be, self supporting, flexible, or both.

As used herein, a flexible working mold can refer to a working mold that can be removed by peeling it away from the master mold at an angle of at least about 30° (in another embodiment at an angle of at least about 45-70°), measured with respect to a planar surface of the master mold, without significant damage, such as cracking, deformation or altering the structured pattern replicated therein. It should also be noted that the working mold can be removed from the master mold in a parallel fashion, for example if a rigid substrate was attached to the working mold. The working mold may be removed from the master mold by, for example, lifting the working mold around its perimeter or by peeling up one leading edge thereof. The peel rate may vary widely depending on the second generation precursor, the master mold material (in an embodiment formed from the first generation precursor), the density of structures in the master mold as well as other factors. Generally, the higher the density of structures in the master mold, the more slowly the working mold should be removed from the master mold.

In an embodiment, the second generation precursor forms a thermoset polymeric material. A thermoset polymeric material can be formed from a precursor of the thermoset polymeric material, which can also be referred to herein as a second generation precursor in the context of the working mold. The second generation precursor can include crosslinkable materials. The crosslinkable materials can be polymerized, so they need only be crosslinked (i.e., cured) to form a thermoset polymeric material; or the crosslinkable material can be polymerizable so they need to be polymerized and crosslinked to form a thermoset polymeric material; or the second generation precursor can contain both crosslinkable and polymerizable materials.

In an embodiment, the glass transition temperature (Tg) of the thermoset polymeric material can be about 35° C. or greater. In an embodiment, the glass transition temperature (Tg) of the thermoset polymeric material can be about 45° C. or greater. In an embodiment, the glass transition temperature (Tg) of the thermoset polymeric material can be about 50° C. or greater. In an embodiment, the glass transition temperature (Tg) of the thermoset polymeric material can be about 55° C. or greater.

Exemplary second generation precursors include, but are not limited to, epoxies, melamines, acrylates, alkyd resins, polyurethane precursors, epoxy acrylates and combinations thereof. Exemplary second generation precursors also include thermoplastic polyimides (i.e., the thermoplastic polyimides can be crosslinked to form thermoset polyimides). In an embodiment, the thermoset polymeric material can be derived from polymerizable materials, e.g., monomers that include acrylate groups, epoxy groups, urethane groups, or some combination thereof. In an embodiment, the thermoset polymeric material can be derived from monomers that include hyperbranched acrylates, urethane acrylates, or a combination thereof.

In an embodiment, the second generation precursor has a viscosity that allows it to be contacted with the master mold. In an embodiment, a second generation precursor having a viscosity that does not allow it to be effectively contacted with the master mold could be contacted with the master mold at a temperature that alters the viscosity in a desired fashion. For example, a second generation precursor that has a viscosity that is too high to be easily contacted with the master mold could be contacted at an elevated temperature where the viscosity is decreased to afford more effective contact.

Exemplary thermoplastic materials include, but are not limited to, polyester, polyimide, polycarbonates, polyvinyl chloride, polypropylene, polyethylene, polymethyl methacrylate and combinations thereof.

The working mold can also be metallic, glass, ceramic, or semiconductive for example. One of skill in the art, having read this specification, would be aware of methods of making working molds using such materials. Suitable metallic materials that can be used include, but are not limited to, copper, aluminum, platinum, stainless steel, gold, nickel, titanium, iron, alloys of any of the metals, or combinations thereof. The metal can, for example, be in the form of a sheet that is pressed against the master mold to form the working mold. Suitable ceramic, glass, or semiconductive working molds can be prepared, for example, by positioning a hardenable composition containing various inorganic materials in contact with the master mold. The hardenable composition can be hardened to form the working mold while in contact with the master mold. The formation of the hardened material often includes the application of heat to and the removal of a liquid such as water from the hardenable composition. That is, the working mold can be formed by drying the hardenable composition while positioned adjacent to the master mold.

The second generation precursor used to form the working mold may optionally be degassed either before or after it is applied to the master mold and following application the material may be, for example, polymerized, crosslinked, dried, or any combination thereof by any suitable technique. For example, in an embodiment the second generation precursor may be cured by photochemical or thermal processes. In an embodiment, the second generation precursor may be cured by a source of radiation, such as ultraviolet (UV) radiation. For example, in an embodiment the second generation precursor may be cured or dried by a source of heat that heats the material from room temperature (or the temperature at which it was applied) to a higher temperature. In an embodiment, the higher temperature is a temperature that does not cause damage to the master mold.

In an embodiment, the working mold can have a thickness that is sufficient to form a free-standing film in which the structures from the master mold are accurately replicated. A free-standing film is a film that will retain features formed therein without any additional support, for example from a backing. The working mold thus includes a second pattern that is a reverse image of at least a portion of the pattern in the master mold (e.g., if the master mold includes an array of protruding structures, such as that seen in FIG. 2a, the working mold will have an array of corresponding depressions or indentations, such as that seen in FIG. 2a). In an embodiment, the working mold can be a free-standing film with a thickness of about 2 mm to 1 cm. In an embodiment, the working mold can have a thickness of about 2 mm to about 8 mm. In an embodiment, the working mold can have a thickness of about 2 mm to about 3 mm.

Methods as disclosed herein also include depositing a release layer on at least a portion of the substrate. The step of depositing a release layer on the substrate generally includes depositing a release layer that includes a silicone containing polymer using PECVD. Generally, a PECVD process or system forms a plasma and deposits a release layer from that plasma on a surface (or surfaces) within a chamber that houses the plasma. The species within the plasma react on the surface of the working mold. The plasma deposition results in species in the plasma becoming randomly attached to the surfaces of the working mold via covalent bonds. The deposited release layer usually constitutes a full layer over the entire exposed working mold, but may constitute less that a full layer over the entire exposed working mold. The release layer usually includes a polymeric material, such as a silicone containing polymeric material, formed from the deposited material.

Depositing a release layer on the substrate or working mold can be carried out by step 120, providing power to the electrode to form a plasma. Providing power to an electrode to form a plasma can be carried out by, for example, providing a power supply to the electrode and activating the power supply to form a plasma. Generally, the step of providing power to an electrode to form a plasma can occur at any time during the method as disclosed herein. In an embodiment, the step of providing power to an electrode can occur before the substrate is placed near the electrode and before introducing vapor of liquid silicone into the plasma. That is, the step of forming a plasma can occur prior to the introduction of the substrate, prior to introducing vapor of liquid silicone into the plasma, or both. In an embodiment, the step of providing power to an electrode can occur before or simultaneous with the step of introducing vapor of liquid silicone into the plasma. In an embodiment, the power is applied first in the presence of a non-release layer depositing gas such as argon or oxygen to prime the working mold before introducing the vapor of liquid silicone, which is when the release layer begins to be deposited. Such a sequence of steps can lead to improved adhesion of the release layer to the working mold and overall durability of the release layer.

As discussed above, methods disclosed herein can be carried out in a PECVD system. PECVD systems include a source of power, or are configured to be attached to a source of power. The power that is supplied to the electrode can be an AC or DC source. In an embodiment, the power source is a RF source, for example. Plasma, containing the release layer forming gas introduced into the chamber, is generated and sustained by supplying power.

In an embodiment, the power can be supplied to at least one electrode by an RF generator operating at a frequency in the range of about 0.001 to 100 MHz. In an embodiment, the RF power source provides power at a frequency in the range of about 0.01 to 50 MHz. In an embodiment, the RF power source provides power at a frequency of about 13.56 MHz or any whole number (e.g., 1, 2, or 3) multiple thereof. The RF power source can be an RF generator such as a 13.56 MHz oscillator. In an embodiment, the power source, such as an RF generator, can be operated at a power level of between about 10 W and 5000 W.

The substrate or working mold to be coated may be placed in, or passed through, the chamber. In some embodiments, a plurality of working molds may be simultaneously or sequentially exposed to the plasma. In an embodiment, the working mold to be coated may be, but need not be, pre-cleaned to remove contaminants that could interfere with the coating. A useful pre-cleaning method is exposure to an oxygen plasma. For this pre-cleaning, pressures in the reactor can be maintained between about 1.3 Pa (10 mTorr) and 27 Pa (200 mTorr). Plasma is generated with RF power levels of between about 500 Watts (W) and 3000 W. Other gases may be used for pre-cleaning such as, for example, argon, air, nitrogen, hydrogen or ammonia, or mixtures thereof.

In an embodiment, the release layer can be deposited by pulsing the power that is supplied to the at least one electrode. Generally, pulsed deposition refers to a process where the RF generator is cycled on and off. Any suitable duty cycle can be used. In an embodiment, plasma deposition can be performed with a 90% duty cycle of the RF generator, with 90% referring to the amount of time that the RF generator is turned on. The frequency of pulsing may be varied from about 1 Hz to about 100 Hz. In an embodiment, the frequency of pulsing is about 10 Hz. Pulsed plasma deposition can function to decrease or eliminate particle formation that can (but doesn't always) occur during plasma deposition of the release layer, can reduce compressive force of the release layer or a combination thereof.

Methods as disclosed herein also include introducing vapor of liquid silicone into the plasma, step 130 in FIG. 1. Generally, the liquid silicone molecules can be introduced into the chamber before they are vaporized for introduction into the plasma. Within the chamber, the vaporized liquid silicone molecules become part of a plasma generated from an inert gas such as argon or helium. As discussed above, PECVD systems that can be utilized herein generally include a chamber, a grounded electrode and a powered electrode. The chamber is generally configured so that gases can be controllably introduced into the chamber. Generally, the gas (or gases) and liquid (or vaporized liquids) that are present during the coating of a substrate and that deposit on the substrate are referred to herein as the release layer forming gas.

In an embodiment, the chamber can, but need not, be evacuated before introducing the materials, to an extent desired, to remove air and any impurities. This may be accomplished by vacuum pumps, which can be located at a pumping stack connected to the chamber. Inert gases (such as argon) may be introduced into the chamber to alter the pressure with the chamber. Once the chamber is evacuated, the materials can be admitted into the chamber via an inlet tube.

The liquid silicone molecules can be introduced into the chamber by introducing the liquid using known liquid transfer techniques. In an embodiment the liquid silicone molecules can simply be placed into the chamber, and in an embodiment, the liquid silicone molecules can be pumped into the chamber via a liquid pumping system. The liquid silicone molecules can be provided into the chamber through any useful means. In one embodiment, the liquid silicone molecules can be disposed on graphite or carbon cloth that is electrically connected to a power source and can therefore be vaporized (by heating the carbon cloth via passing current through the carbon cloth) within the chamber while being shielded from the plasma with a Faraday cage. In an embodiment, a current up to several Amperes (A) can be applied to such carbon heating cloths in order to vaporize the liquid silicone molecules. In an embodiment utilizing a one inch wide carbon cloth, a current of between 1 and 2 Amperes can be maintained, for example a current of 1.7 A.

In an embodiment, a liquid silicone molecule is a molecule that contains silicon, is a liquid at atmospheric conditions, can be vaporized and is capable of being polymerized.

In an embodiment, a liquid silicone molecule has a backbone of repeating monomer units that include at least one silicon atom. In an embodiment, the liquid silicone molecule is of formula I:

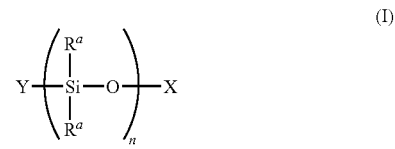

(I)

where $R^a$ are independently H, OH, alkyl, aryl or alkoxy; X is H, alkyl, —Si($R^a$)$_3$, —Si($R^a$)$_2$—Y, or X and Y together form a single bond; Y is H, —OH, Cl, F, Br, I, —NH$_2$, aryl, —OSi($R^a$)$_3$, or X and Y together form a single bond; and n is an integer from 3 to 13,000. In an embodiment where X and Y together form a single bond, the molecule is cyclic in nature.

As stated above, n can be an integer from 3 to 13,000. In an embodiment, n is an integer from 3 to 3000. In an embodiment, n is an integer from 3 to 2000. In an embodiment, n is an integer from 3 to 1000. In an embodiment, n is an integer from 3 to 500, from 3 to 100, from 5 to 100, or from 10 to 100.

Generally, the molecular weight (Mn) of liquid silicone molecules that can be used herein can range from about 100 to about 1,000,000. In an embodiment, the molecular weight (Mn) of liquid silicone molecules that can be used herein can range from about 200 to 300,000. In an embodiment, the molecular weight (Mn) of liquid silicone molecules that can be used herein can range from about 200 to 100,000. In an embodiment, the molecular weight (Mn) of liquid silicone molecules that can be used herein can range from about 500 to 10,000.

In an embodiment, the liquid silicone molecule is of formula II:

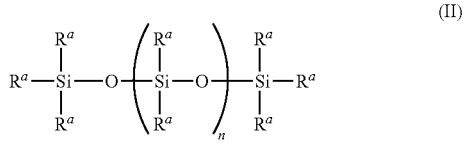

(II)

where $R^a$ are independently H, OH, alkyl, aryl, or alkoxy; and n is an integer from 1 to 13,000. Generally, compounds of formula II are commonly referred to as "silicone oils". In an embodiment where the liquid silicone oligomer is of formula II, n can be an integer from 3 to 3000. Formula II is a subset of formula I.

In an embodiment, the liquid silicone oligomer is of formula III:

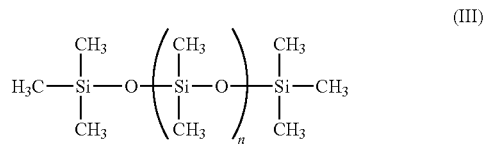

(III)

where n is an integer from 3 to 3000. An exemplary compound of formula III includes polydimethylsiloxane. Commonly utilized polydimethylsiloxanes generally have molecular weights from about 1 to about 100. Formula III is a subset of formula I and formula II.

A secondary reactant may also be added to the chamber in combination with the liquid silicone molecule. In an embodiment, the secondary reactant can be added to the chamber at substantially the same time as the liquid silicone molecule or at a different time as the liquid silicone molecule. In an embodiment, the secondary reactant can be added to the chamber before the liquid silicone molecule or after the liquid silicone molecule.

In an embodiment, the secondary reactant is a gas. The secondary reactant gas can be added to the chamber at a desired flow rate, which can depend at least in part, on the size of the reactor, the surface area of the electrodes, the porosity of the articles to be treated, the desired thickness of the release layer, and other factors. The flow rate can generally be chosen as sufficient to establish a suitable pressure at which to carry out the coating, typically 0.13 Pa to 130 Pa (0.001 Torr to 1.0 Torr). For a square reactor that has inner dimensions of 45 cm×45 cm×7.5 cm, the flow rates are typically from about 50 to about 250 standard cubic centimeters per minute (SCCM). At the pressures and temperatures of coating (typically 0.13 to 133 Pa (0.001 to 1.0 Torr) (all pressures stated herein are absolute pressures) and a temperature less than 50° C.), the release layer forming gases generally remain in their original form without any polymerization.

In an embodiment, the secondary reactant gas can include a silicon containing gas, oxygen or an hydrocarbon such as an alkane or alkene. Different and varying amounts of such components can be utilized in combination with the liquid silicone molecules. The amount of secondary reactant can affect the properties of the release layer formed thereby.

In an embodiment, oxygen is utilized as a secondary reactant gas. Utilizing oxygen as a secondary reactant can contribute to advantageous properties of the film. In an embodiment, including oxygen gas as a secondary reactant can provide films having higher surface energies. Generally, inclusion of $O_2$ as a secondary reactant can increase the surface tension of the film (when compared with a film from a liquid silicone oligomer only). Generally, the $O_2$ can function to increase the surface tension by forming hydroxyl groups on the surface of the film which will increase the surface tension. Films having higher surface energies can be advantageous because it enhances wetting of the working mold surface by the third generation precursor. Better wetting of the mold surface can generally provide higher fidelity molded articles.

In an embodiment, the secondary reactant is a silicon containing gas. The addition of a silicon containing gas can function to enhance the degree of crosslinking of the silicone containing polymer included in the release layer. Silicon containing gas can also function to increase the surface tension of the release layer. In an embodiment, the secondary reactant is a silicon containing gas having the formula: $Si(R^a)_3R^b$ wherein $R^a$ is independently H, alkyl, or alkoxy; and $R^b$ is independently H, alkyl, alkoxy, —$OSi(R^a)_3$, or —$Si(R^a)_3$. In an embodiment, all $R^a$ substituents within a single silicon containing gas are the same; and in an embodiment, at least one $R^a$ substituent in a single silicon containing gas is different. In an embodiment, $R^a$ and $R^b$ are the same; and in an embodiment, $R^a$ and $R^b$ are different. In an embodiment, the silicon containing gas is tetramethylsilane (also referred to as "TMS"), $Si(CH_3)_4$; tetraethylorthosilicate (also referred to as "TEOS") $Si(OCH_2CH_3)_4$; hexamethyldisiloxane, $Si(CH_3)_3$—O—$Si(CH_3)_3$; hexamethyldisilane $(CH_3)_3Si$—$Si(CH_3)_3$; silane $SiH_4$; or a combination thereof. In an embodiment, the, silicon containing gas is tetramethylsilane, $Si(CH_3)_4$.

In an embodiment, hydrocarbon compounds can be utilized in combination with the liquid silicone molecule. In an embodiment, the hydrocarbon compound can be an alkane or alkene compound that is a gas at the coating conditions. In an embodiment, any alkane or alkene gas that can be introduced into the chamber as a gas can be utilized. In an embodiment, the hydrocarbon compound is a $C_5$ or lower alkane or alkene compound. Exemplary alkane and alkene compounds that can be added include, but are not limited to, butane, propane, pentane, pentene, pentadiene, butane, butadiene, or combinations thereof. The addition of hydrocarbon compound can, but need not, be utilized to provide the release layer on the working mold with diamond like carbon (DLC) properties. Hydrocarbon compounds if added can be added in amounts that make the volume percent of silicon containing gas to alkane compound about 10% to about 90%.

The release layer that is formed on the substrate, or more specifically working mold, generally includes a silicone containing polymer. In an embodiment, the film can also contain other components. In an embodiment, other components introduced into the chamber (such as secondary reactant gases), decomposition products of the liquid silicone molecules (or secondary reactant gases), or a combination thereof can also be included in the release layer.

In an embodiment, the release layer has a generally substantially uniform coating thickness over at least a portion of the surface of the working mold. A release layer with a substantially uniform thickness can afford a more uniform molded article. Generally, as release layers become thicker, they can be affected by compression of the release layer itself. Compressive forces on a release layer that is too thick can cause wrinkling in molded articles after extended use of the working mold. In an embodiment, a wrinkled surface of a molded article could provide advantageous properties, for example gain diffusers could benefit from such random substructures. Release layers that are thinner generally don't provide as much benefit as thicker release layers. For example, as the thickness of a release layer is decreased, the durability that is afforded by that release layer can be minimized.

In an embodiment, the release layer is formed on at least a portion of the structured surface of the working mold. In an embodiment, the release layer is formed on substantially the entire surface of the working mold. Generally, larger coverage of the surface of the working mold affords greater advantages from the release layer.

The thickness of a release layer can be estimated by calculation, measurement or both. Generally, the thickness of a release layer is dependent, at least in part, on the deposition rate of the release layer. The deposition rate can be determined using a flat silicon (Si) wafer as a control sample. The thickness on the flat Si wafer can then be determined using, for example, thin film white light interferometry. Once the thickness of the release layer on the Si wafer is determined, the thickness of the release layer on the patterned substrate can be determined by considering the geometry of the pattern. In an embodiment where the working mold has random or complicated structures, calculation of the thickness of the release layer on the patterned surface may be difficult. The thickness of the release layer on the Si wafer in such a situation can provide a usable estimate of the thickness of the release layer on the patterned surface.

In an embodiment, a release layer is generally about 1 nm to about 1000 nm thick. In an embodiment, the release layer is generally about 5 nm to about 300 nm thick. In an embodiment, the release layer is generally about 5 nm to about 100 nm thick. In an embodiment, the release layer is generally about 5 nm to about 50 nm thick. The thickness of the release layer can be controlled, at least in part, by the power supplied to the electrode, the amount of release layer forming gas introduced into the chamber, the time that the working mold is exposed to the plasma, as well as other factors. Generally, the time of deposition is related, often in a linear fashion, to the thickness of the release layer. One of skill in the art, having read this specification, would know the parameters to be controlled, and how to control them in order to obtain the desired release layer thicknesses.

Another exemplary method such as this includes placing a substrate near (e.g., on) an electrode in a chamber, the substrate having at least a first structured surface; providing power to the electrode to create a plasma; vaporizing liquid silicone molecules in the chamber; depositing a release layer, the release layer including a silicone containing polymer, the release layer being deposited on at least a portion of the first structured surface of the substrate to form the working mold. Another exemplary method includes a method of forming a molded article including: placing an untreated working mold near (e.g., on) an electrode in a chamber, the untreated working mold having at least a first structured surface; providing power to the electrode to create a plasma; vaporizing liquid silicone monomers in the chamber; depositing a release layer, the release layer including a silicone containing polymer, the release layer being deposited on at least a portion of the first structured surface of the substrate to form the working mold; and contacting a third generation precursor with at least a portion of the first surface of the working mold to form a molded article that is the inverse of the first structured surface of the working mold.

Methods as disclosed herein can also be done in a continuous fashion. A method that is stated as continuous generally means that the contacting process may be substantially continuous (which means that the process does not stop during the contacting steps used to make the molded articles) or stepwise continuous (their can be pauses during, before or after contact steps). In an embodiment, substantially continuous methods are utilized.

Examples of stepwise continuous processes include injection molding, resin transfer molding, compression molding and the like. Examples of substantially continuous processes include roll-to-roll processes. In a substantially continuous process, the working mold may be utilized to form a continuous tool. An example of a continuous tool includes a working mold that has been mounted on a rotating drum to create molded articles on a carrier film using a roll-to-roll process. The working mold may also be converted before being placed on a rotating drum (for example) as desired by, for example, cutting to size or shape.

Figure 3:
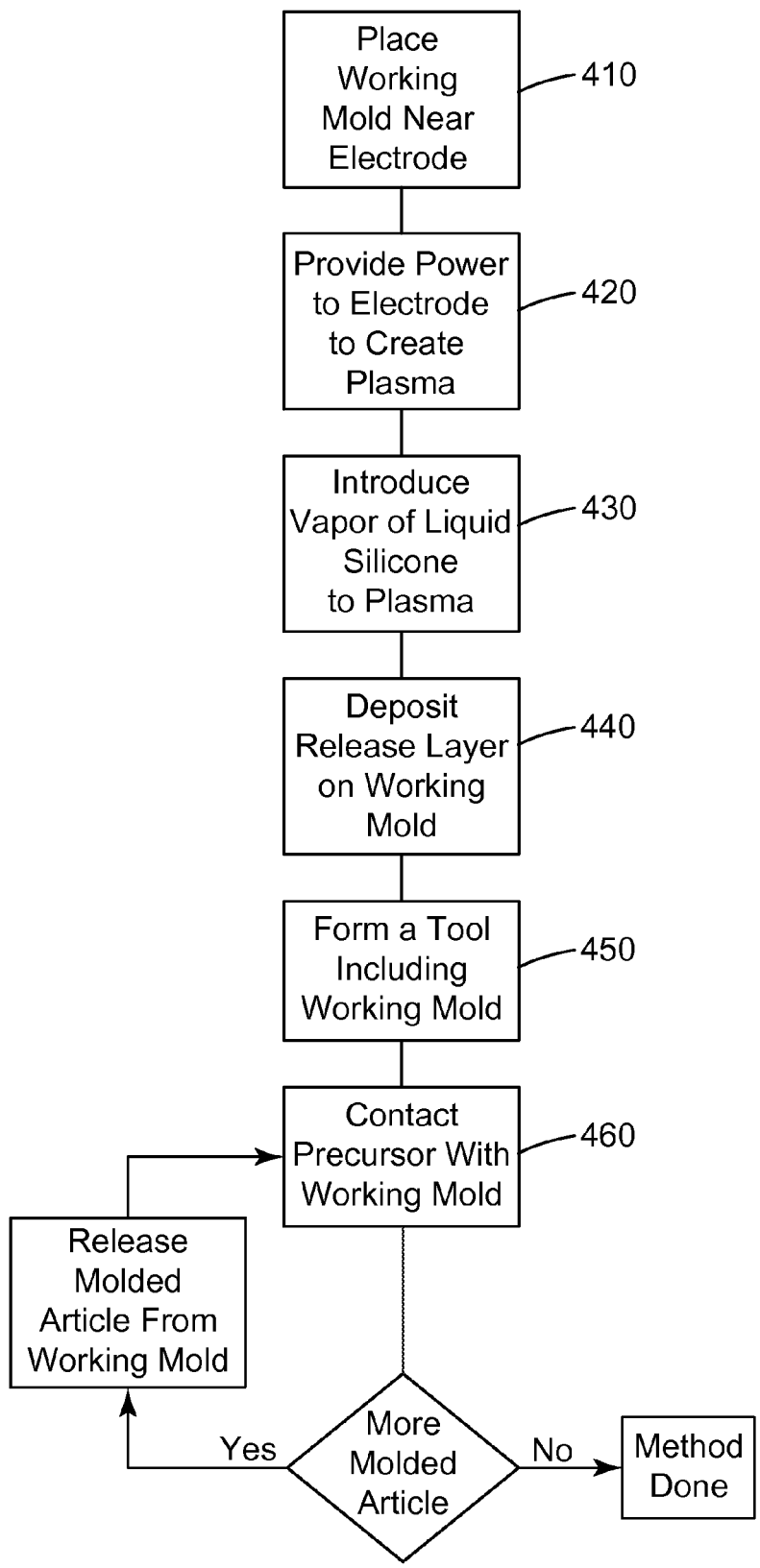
FIG. 3 depicts an embodiment of a method as disclosed herein.

An exemplary method as disclosed herein includes a method as disclosed in FIG. 3. Such a method includes step 410, placing the working mold near an electrode; step 420, providing power to the electrode to form a plasma, step 430, vaporizing liquid silicone molecules; step 440, depositing a release layer on the working mold; step 450 forming a tool including the working mold; step 460, contacting the third generation precursor with the working mold and if more molded article is to be formed; step 470 removing the molded article from the working mold; and carrying out step 460 again; and if no more molded article is to be made, completing the method.

Working molds that are formed using methods as described herein can be utilized to create molded articles. Molded articles formed using working molds as described herein can also be referred to herein as replicas. Methods of forming molded articles include a step of contacting a third generation precursor, in an embodiment a polymeric precursor, with at least a portion of a first surface of the working mold to form a molded article.

Generally, any material that can be used to form a molded article using a working mold, as described herein, can be brought into contact with at least a portion of the working mold. In an embodiment, the third generation precursor can be a material that can be contacted with the working mold and will or can be hardened. In an embodiment, the third generation precursor can be a material that has a viscosity that allows it to be coated, spread, or contacted with the working mold and will or can be subsequently hardened to form a molded article. In an embodiment, the third generation precursor can be a material that can be contacted with the working mold and will or can be hardened. In an embodiment, the third generation precursor can be a material that has a viscosity that allows it to be coated, spread, or contacted with the working mold and will or can be subsequently hardened to form a molded article. In an embodiment, the material that is contacted, or a third generation precursor can include polymerizable material, polymerized material, or both. The third generation precursor can be one that will form a thermoset polymeric material, a polymerized and crosslinked material; or one that will form a thermoplastic material, polymerized but not crosslinked.

Figure 4A:
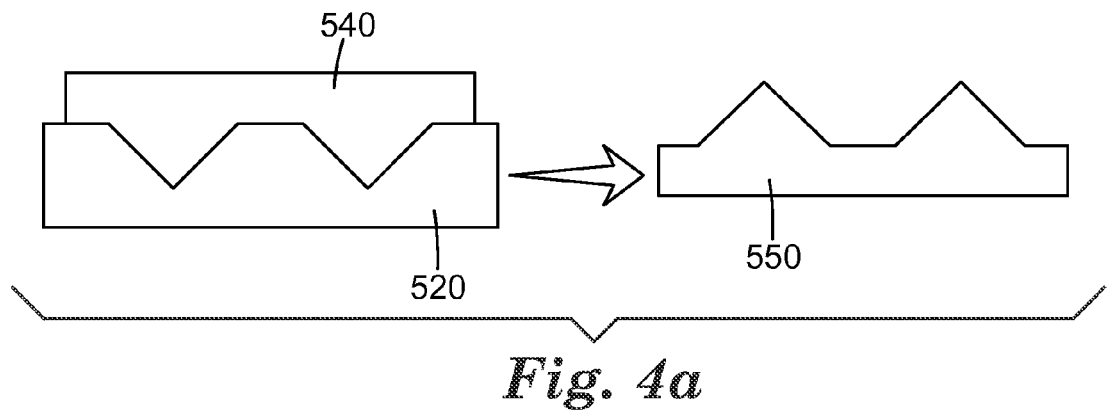
FIGS. 4a and 4b schematically illustrate steps of making a working mold from a master mold.

The third generation precursor can be brought into contact with the working mold in any fashion generally utilized. In an embodiment, a third generation precursor can be deposited on at least a portion of the working mold. FIG. 4a illustrates such a step. As seen in FIG. 4a, a third generation precursor 540 is applied to at least a portion of the working mold 520. Once the third generation precursor 540 is removed from the working mold 520, as designated by the arrow in FIG. 4a, the third generation precursor forms a molded article 550

Figure 4B:
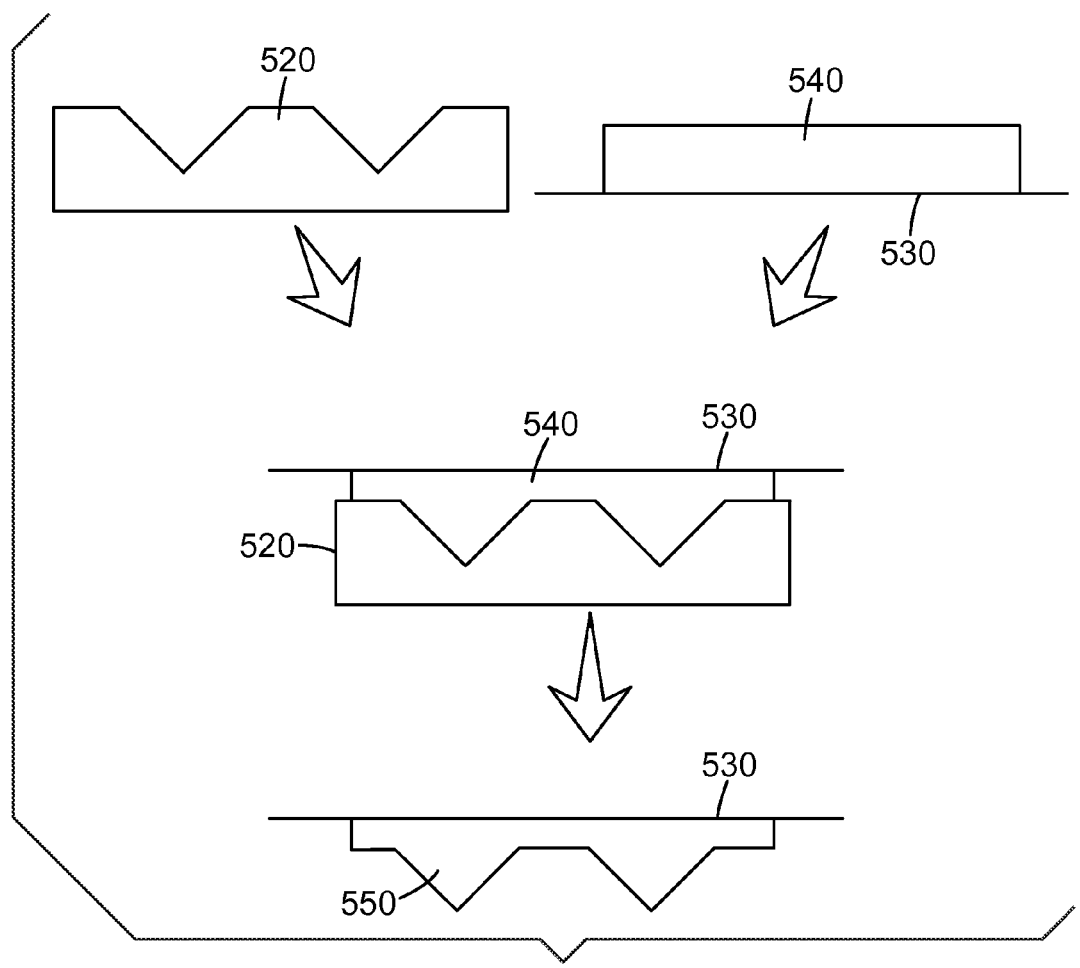

In an embodiment, the third generation precursor can be deposited on at least a portion of a backing and the third generation precursor and the working mold can be brought into contact with one another. FIG. 4b illustrates such a step. As seen in FIG. 4b, a third generation precursor 540 is applied to at least a portion of a backing 530. The backing 530 with the third generation precursor 540 disposed thereon is then brought into contact with the working mold 520, as designated by the double arrows in FIG. 4b, and as shown in the second pane of FIG. 4b. The working mold 520 is then peeled away from the third generation precursor 540, as designated by the single arrow in FIG. 4b, to create a molded article 550 disposed on the backing 530. The backing 530 can either remain in contact with molded article 550 (as shown in FIG. 4b) or can be separated therefrom (not depicted in the figures).

Polymeric precursors (for example a first generation precursor, a second generation precursor or a third generation precursor) as utilized herein can include polymers or monomers. In an embodiment, a third generation precursor can include polymerized material. In an embodiment, the third generation precursor can include polymerizable materials, e.g. monomers or oligomers. In an embodiment, the third generation precursor can include a combination of polymerized and polymerizable material. In an embodiment where the third generation precursor includes monomer, the third generation precursor can be polymerized once contacted with the working mold. In an embodiment where the third generation precursor includes only polymer, the third generation precursor does not need to be polymerized once contacted with the working mold (but in the case of a precursor to a thermoset polymeric material, does need to be crosslinked). The third generation precursor can be, but need not be crosslinkable.

Specific types of third generation precursors that can be utilized can depend, at least in part, on the final molded article that is being made. The third generation precursor can include polymerized, polymerizable or both materials. The molded article can be polymerized only (a thermoplastic molded article), or can be polymerized and crosslinked (a thermoset molded article). Exemplary third generation precursors that can be utilized include, but are not limited to, polycarbonates; polyacrylates such as urethane acrylates and polymethyl methacrylate; polystyrene; silicone polymers, polyolefins, polyimides, and thermoplastic urethanes.

In an embodiment, other components can be added to the third generation precursors before they are brought into contact with the working mold. Generally, such optional components can be added to the third generation precursor to modify one or more properties of the third generation precursor to enhance the formation of a molded article from the working mold. An example of such an optional component includes, but is not limited to, a material that could improve the wetting of the third generation precursor on the working mold. An exemplary material that could be utilized to improve wetting includes a material that could decrease the surface tension of the third generation precursor. Exemplary materials include silicone containing acrylate monomers (at an amount from about 0.3 to 5% by weight of the third generation precursor) and surfactants, such as fluorine containing surfactants for example (e.g. FC4430 (3M Co., St. Paul, Minn.)) (at an amount from about 0.1 to 1% by weight of the third generation precursor; and in an embodiment less than about 0.6% by weight of the third generation precursor).

Typical articles made using methods described herein include, for example, prismatic structures for light management films, microfluidic devices, sensors, ring resonators, microneedles for transdermal drug delivery, moth-eye anti-reflective surfaces and abrasive articles. In an embodiment, methods as disclosed herein can be utilized to manufacture optical materials such as light guides. For example, light guides including microstructures can be fabricated from a wide variety of materials including polycarbonates; polyacrylates such as urethane acrylates and polymethyl methacrylate; polystyrene; silicone polymers, polyolefins, and thermoplastic urethanes. In an embodiment, optically suitable high refractive index materials such as polyacrylates and polycarbonates can be utilized. The exemplary light guides can be especially useful in backlit displays (for example, including a light source, a light gating device (for example, a liquid crystal display (LCD)), and a light guide) and keypads (for example, comprising a light source, an array of pressure-sensitive switches at least a portion of which transmits light, and a light guide). The light guides can also be useful as point to area or line to area back light guides for subminiature or miniature display or keypad devices illuminated with light emitting diodes (LEDs) powered by small batteries. Suitable display devices include, but are not limited to, color or monochrome LCD devices for cell phones, pagers, personal digital assistants, clocks, watches, calculators, laptop computers, vehicular displays, and the like. Other display devices include flat panel displays such as laptop computer displays or desktop flat panel displays. Suitable backlit keypad devices include keypads for cell phones, pagers, personal digital assistants, calculators, vehicular displays, and the like.

Figure 5:
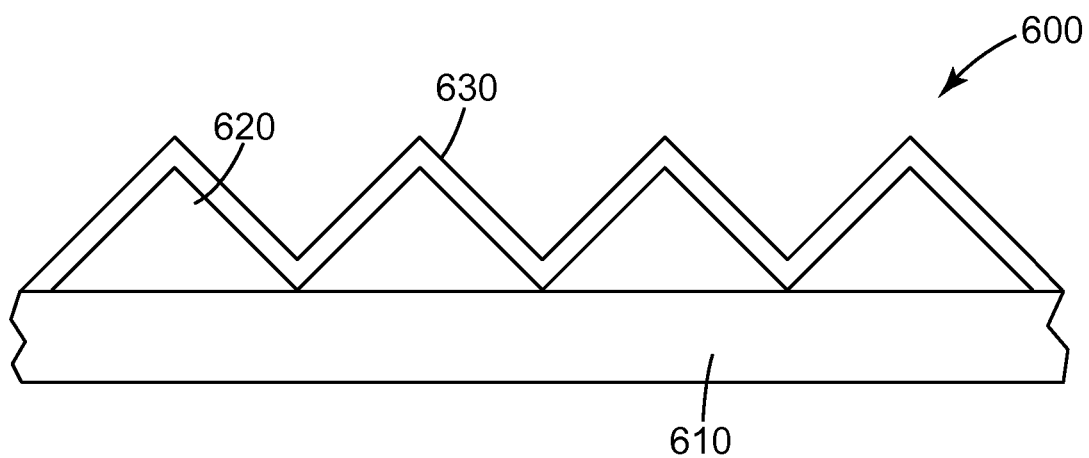
FIG. 5 depicts an exemplary working mold.

FIG. 5 illustrates an exemplary working mold that can be formed using methods disclosed herein. The working mold 600 seen in FIG. 5 includes a mold substrate 610 and a structured surface 620 formed thereon. Although this exemplary working mold includes a mold substrate 610 and structured surface 620 that are two separate pieces, one of skill in the art, having read this specification, will understand that the structured surface could be formed in the substrate material. The exemplary working mold 600 also includes a release layer 630 disposed on the structured surface 620. The substrate 610 and structured surface 620 without the release layer 630 is an example of an untreated working mold.

In an embodiment, a release layer that is deposited on a working mold can function to provide one or more advantageous properties to the working mold or molded articles formed using the working mold. In an embodiment, the release layer can provide the working mold with desired release properties, enhanced durability, the ability to create molded articles having high fidelity and the ability to create molded articles without significant transfer of the working mold or release layer material, for example.

In an embodiment a release layer that is deposited on a working mold can function to provide the working mold with desirable release properties from materials that are contacted therewith (e.g. a third generation precursor) to form a molded article. Release and anti-adhesion are generally used interchangeably throughout. Generally, working molds having good release properties from a molded article are desired. A working mold with good release properties will generally have a low peel force. Peel force measurements can be measured as known by one of skill in the art. An exemplary method of measuring peel force includes use of a Slip/Peel Tester such as a Model SP-2000, commercially available from IMASS, Inc. (Accord, Mass.). Specific parameters surrounding a peel test measurement that can be carried out using a Model SP-2000 Slip/Peel Tester include a peel angle of 180° and a peel rate of 12 inches/minute.

In an embodiment, a working mold has a peel force between the working mold and a molded article of less than about 300 grams/inch. In an embodiment, a working mold has a peel force between the working mold and a molded article of less than about 100 grams/inch. In an embodiment a working mold has a peel force between the working mold and a molded article of less than about 50 grams/inch. In an embodiment, a working mold has a peel force between the working mold and a molded article of less than about 30 grams/inch. In an embodiment, a working mold has a peel force between the working mold and a molded article of less than about 10 grams/inch.

In an embodiment, a working mold formed using a method as disclosed herein has release properties between the working mold and the molded article that do not significantly degrade over time. For example, a working mold can desirably have adhesion between the working mold and the molded article that does not increase over time. This can be an indication of the durability of the working mold. In an embodiment, the peel force between a working mold and the molded article does not increase more than 50% after forming multiple molded articles. In an embodiment, the peel force between a working mold and the molded article does not increase more than 20% after forming multiple molded articles. In an embodiment, the peel force between a working mold and the molded article does not increase more than 10% after forming multiple molded articles. In an embodiment, forming multiple molded articles an refer to forming at least 10 molded articles.

In an embodiment, the release layer provides a working mold with enhanced durability. The durability of a working mold refers to the ability of the working mold to function to form molded articles and maintain desirable properties with use. Durability of a working mold can be advantageous in all use of working molds to form molded articles, but can be especially advantageous when using working molds in continuous methods. An exemplary method of assessing the durability of a working mold formed using methods herein includes aging experiments. Aging experiments generally accelerate the effects of use on a working mold. One method of simulating such accelerated use is to subject the working mold to elevated temperatures for an extended period of time. For example, a working mold can be subjected to a temperature of about 55° to 70° C. from about 8 hours to about 24 hours. Once the working mold has been subjected to such conditions, molded articles can once again be formed using the working mold (i.e. contacting the working mold with a third generation precursor and curing the third generation precursor), or further peel testing can be carried out on the working mold in order to assess the durability of the working mold. This cycle (time in the oven and formation of a molded article) can be repeated multiple times to simulate aging.

The durability of a working mold can also be monitored in real time, for example, the number of molded articles produced from a working mold, the number of feet of molded articles produced from a working mold (in a continuous method), the number of revolutions the working mold has made (in a continuous method that utilizes the working mold on a roll), or some combination thereof can be monitored. A working mold can be said to be durable for a particular amount of molded articles (either length of molded article produced or revolutions of the working mold, for example) if the working mold, after having produced that particular amount of molded article, can still be effectively utilized to form molded articles (e.g. can be released from a molded article), doesn't show visible signs of fatigue (such as cracking, wrinkling, or transfer to the molded article), or some combination thereof.

In an embodiment, working molds formed using methods as disclosed herein can be utilized in continuous methods for at least about 300 revolutions (when the working mold is used as part of a rotating tool, for example). In an embodiment, working molds formed using methods as disclosed herein can be utilized in continuous methods for at least about 1500 revolutions (when the working mold is used as part of a rotating tool for example). In an embodiment, working molds formed using methods as disclosed herein can be utilized in continuous methods for at least about 3000 revolutions (when the working mold is used as part of a rotating tool for example).

In an embodiment, a working mold as disclosed herein affords the ability to create molded articles with high fidelity. Generally, molded articles with high fidelity will be very accurate representations of the working mold that they were formed with. Molded articles having high fidelity are advantageous because the purpose of molding an article is to create an exact replica of the working mold. Generally, high fidelity is affected by the ability of the third generation precursor to be molded to wet the surface of the working mold. The better the third generation precursor can wet the surface, the less likely there are to be air bubbles or voids which can lead to a defect in a molded article. Factors that can influence the fidelity of molded articles include, but are not limited to, the viscosity of the third generation precursor, the wetting of the working mold by the third generation precursor, capillary forces, and combinations thereof. Capillary forces can become increasingly important as the size of the features in the working mold become smaller, in an embodiment, as the features of the working mold approach tens of nanometers. Poor wetting of a working mold by a third generation precursor can, but does not always, lead to molded articles having a rough surface.

In an embodiment, a working mold as disclosed herein affords creation of a molded article with minimal, no measurable transfer, or no transfer of material from the working mold or the release layer deposited on the working mold to the molded article itself. Transfer of the materials making up the working mold or a release layer deposited on the working mold is generally considered to be a disadvantage when forming a molded article. Transferred material can interfere with further processing that can be occurring to the molded article, can create defects in the molded article, can detrimentally affect relevant properties of the molded article, can minimize the durability of the working mold, or a combination thereof.

In an embodiment, a working mold as disclosed herein also generally has good bonding between the working mold and the release layer deposited thereon. This can be important for increasing and/or maintaining durability of the working mold, minimizing transfer from the working mold, or a combination thereof. In general, vapor deposition processes that produce layers using high energy plasma states afford excellent adhesion between the substrate and the layer deposited thereon.

In an embodiment, working molds as disclosed and formed herein have advantageous stability even when exposed to ultraviolet (UV) radiation. In an embodiment, working molds that are formed as disclosed herein can be used in processes where the third generation precursor is cured using UV light because the working molds are generally stable even upon exposure to UV radiation. This can be advantageous to many processes because the durability of the working mold will not be detrimentally affected by using UV curable molding materials.

In an embodiment, the release layer formed on the working mold can also provide a barrier to stop or minimize third generation precursor from reaching the working mold itself. This can be advantageous because minimizing the amount of third generation precursor that reaches the working mold can enhance the durability of the working mold. In an embodiment, the release layer formed on the working mold can provide better barrier properties than a boundary layer formed on the working mold would. The release layer also likely has better adhesion to the mold than a boundary layer would, thereby offering further advantages.

EXAMPLES

Materials and Methods

Unless otherwise noted, all chemicals were obtained from Aldrich and were used without further purification.

A number of examples (noted in the particular examples) utilized 3M® Vikuiti™ Brightness Enhancement Film II (BEF-II90/24) as a working mold on which to form various release layers. The BEF-II90/24 has prisms with a 90° angle and a 24 micrometer pitch. The particular Vikuiti™ Brightness Enhancement Film II that were utilized herein had a 2 mil (referred to herein as "BEF") polyethylene terephthalate (PET) backing.

Unless otherwise indicated herein, the liquid silicone molecules were disposed on carbon ribbons at both sides of the chamber that were electrically connected to a power source within the chamber while being shielded from the plasma with a Faraday cage. In an embodiment, a current of about 1.7 A was utilized, which generally heated the liquid silicone molecule to about 350° C. The liquid silicone molecule utilized in the examples was DMS-T11 silicone oil (Gelest, Inc., Morrisville, Pa.) and is referred to herein simply as "DMS".

Plasma coating was carried out using a in-house constructed plasma chamber described in United States Patent Publication No. 20080196664, the disclosure of which is incorporated herein by reference. Coating thicknesses were measured using Ocean Optics' USB-2000 equipment (via light interference) with a flat silicon wafer as a reference substrate. The flat thickness of the film on the BEF is the measurement, and therefore the thickness of the film (taking into consideration the structure of the BEF) can be calculated as the flat thickness/$\lambda/\sqrt{2}$.

A number of examples (noted in the particular examples) utilized "Resin 1" as the material which was disposed on the working mold to form a polymeric article. Resin 1 was a 3:1 ratio (wt %) of PHOTOMER® 6210 aliphatic urethane diacrylate (Cognis Corp., Ambler Pa.) and SR238 1,6 hexanediol diacrylate (HDDA) (Sartomer Company, Inc., Exton, Pa.) with 1% IRGACURE® 819 photoinitiator (Ciba Specialty Chemicals, Basel, SWITZERLAND).

A number of examples (noted in the particular examples) utilize primed PET films. The primed PET film referred to herein is a 2 mil polyethylene terephthalate (PET) film available as PET #618 from DuPont (DuPont Wilmington, Del.).

The working molds were utilized to form a molded article by applying a resin (second generation precursor) to the working mold, covering the resin coated working mold with a primed PET film (as discussed above) and then applying pressure to the primed PET film to spread the resin and remove any air bubbles. The resin was then cured (except where noted otherwise) using a Fusion UV Systems, Inc. UV curing system (Fusion UV Systems, Inc., Gaithersburg, Md.). A hydrogen (H) or deuterium (D) bulb was utilized at 600 W and the web speed was set at 20 feet/minute (fpm).

Aging was simulated by the following protocol. The unitary structure of the working mold, resin and primed PET film was placed in an oven set at about 55° C. to 70° C. for a set amount of time, for example 8 to 24 hours. The resin was then UV cured (as discussed above) and the molded article was peeled off of the working mold. Carrying out these steps (placing the unitary structure in the oven, UV curing and removing the molded article) once is referred to as one cycle. An overall aging time refers to the total time that unitary structures including a single working mold were in the oven, which was not necessarily accomplished by multiple similar oven times, but could have been accomplished by multiple different oven times.

Scanning electron microscopy (SEM) and optical microscopy were used routinely for determining the quality of the molded articles and the working molds.

Example 1

BEF films (about 5×7 inches) were primed with argon gas at a flow rate of 250 standard $cc^3$/min (SCCM), a pressure of 25 mTorr and RF power of 1000 Watts for 20 seconds. DMS (2 mls) was vaporized as discussed above into the argon plasma and the plasma was maintained for about 30 seconds. The thickness of the release layer was determined as discussed above to be about 200 nm. Once coated, the working molds were washed with ethanol (to remove any residual silicone oil present on the surfaces), dried by compressed air and then mounted on an Al plate using Teflon tape (3M #5490). Resin 1 with 0.6% of 3M™ Novec™ FC4430 fluorosurfactant was used to form molded articles. Easy release when forming the molded articles and good fidelity of the molded articles was observed.

Example 2-5

The working mold in Example 2 was a BEF film and the working mold in Example 3 was a polyimide working mold. The polyimide working mold was a structured polyimide, which was cut by excimer laser ablation to have a pattern of inverse cones using a 5 mil polyimide H film (DuPont Wilmington, Del.). The cones had an angle of about 60°, a diameter of about 40 micrometers and a height of about 35 micrometers. The molds were primed with argon gas at a flow rate of 250 standard $cc^3$/min (SCCM), a pressure of 25 mTorr and RF power of 600 Watts for 10 seconds. DMS (2 mls) was vaporized as discussed above and oxygen at a flow rate of 200 SCCM were introduced into the plasma and the release layer was coated for about 30 seconds. The pressure in the chamber was 55 mTorr and the RF power was set at 600 Watts. The thickness of the release layers was determined as discussed above to be about 200 nm.

Once coated, the working molds were first washed with ethanol (to remove any residual silicone oil present on the surfaces), dried by compressed air and then mounted on an Al plate using Teflon tape (3M#5490). Resin 1 was disposed on top of the working molds and molded articles were formed as discussed above. After UV curing, the molded articles on the PET films were peeled off of the working molds. Both samples showed an easy release from the working mold. Good release, good durability, and good replication fidelity were also observed for both samples after aging for at least 200 hours.

Examples 4 (BEF working mold) and 5 (polyimide working mold) were carried out in the same way except oxygen flow rate was changed to 100 SCCM. Good release, good durability, and good replication fidelity (with Resin 1) were observed for both molds after aging for at least 200 hours.

Examples 6 and 7

A BEF working mold (Example 6) and a polyimide working mold (Example 7) (both about 5×7 inches) were plasma coated to form a two layered coating using DMS-T11 and tetramethylsilane (TMS) under the following conditions. The molds were primed with argon gas at a flow rate of 250 standard cc$^3$/min (SCCM), a pressure of 25 mTorr and RF power of 600 Watts for 10 seconds. The first layer was formed by vaporizing 2 mls of DMS as discussed above with an TMS flow rate of about 130 SCCM and was coated for about 30 seconds. The second layer was formed by introducing tetramethylsilane (TMS) at a flow rate of 130 SCCM at 600 Watts for 10 seconds. The thickness of the silicone/TMS layer was about 200 nm; and the thickness of the TMS top layer was about 30 nm.

Resin 1 was disposed on top of the working mold and a molded article was formed as discussed above. Good release, good durability, and good replication fidelity were observed after aging for at least 200 hours Example 8

A nickel (Ni) master mold having hexagonally close packed convex structures with a diameter of about 100 micrometers and a height of about 25 micrometers was utilized to form a working mold. Resin 1 was applied to the 5 mil PET backing and UV cured against the Ni master mold. After peeling off from the Ni mold, the working mold was formed. The working mold had hexagonally close packed concave structures with a diameter of about 100 micrometers and a height of about 25 micrometers.

A 5×6 inch working mold (as discussed above) was plasma coated using the same conditions as used in Example 5. Once coated, the working molds were washed with ethanol (to remove any residual silicone oil present on the surfaces), and dried by compressed air.

The working mold was mounted on a 12 inch diameter Cr finish metal roll using 3M® #8403 tape. The metal roll was pre-heated to a temperature of 55° C. Resin 1 was utilized for replication and a primed PET film (DuPont #618) was used as a backing. The web speed was changed from 40 ft/min to 80 ft/min. A total of 15,600 feet was run (~5,000 revolutions). The used working mold, once washed with isopropanol alcohol (IPA) was still in excellent condition. High durability and easy release (with good wetting of monomers) were observed when using this working mold.

After 5000 revolutions the mold showed 18% Si (and 0.9% Sn) on the surface as determined by x-ray Photoelectron Spectroscopy (XPS or ESCA) analysis. The surface originally showed 35% Si (and 0% Sn) on the surface (before any molded article had been formed). There was no Si detected by XPS on samples of the molded article taken at 3000 ft, 9000 ft, 12,000 ft and 15,600 ft (detection limit of Si: <0.5 atomic %).

Example 9

A 2×2 inch Cu coupon with a diamond turned (DT) pattern similar to the BEF film (90 degree prism angle and 24 micrometer pitch) was utilized as the working mold in this example. The working mold was primed with argon gas at a flow rate of 250 standard cc$^3$/min (SCCM), a pressure of 25 mTorr and RF power of 1000 Watts for 10 seconds. DMS (2 mls) was vaporized as discussed above and oxygen at a flow rate of 100 SCCM was introduced into the plasma and the release layer was coated for about 30 seconds. Once coated, the working mold was washed with ethanol (to remove any residual silicone oil present on the surfaces) and dried by compressed air.

Resin 1 was disposed on top of the working mold and a molded article was formed as discussed above. After UV curing, the PET film (with molded article attached) was peeled off easily. The molded article showed high fidelity as evidenced by SEM.

The working mold was aged and used to form molded articles discussed above. The working mold showed good release after total aging of at least 200 hours.

Thus, embodiments of methods of forming molds and methods of forming articles using said molds are disclosed. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A method of forming a working mold comprising:
   placing a substrate near an electrode in a chamber, the substrate having at least a first structured surface;
   providing power to the electrode to create a plasma;
   introducing vapor of liquid silicone molecules of Formula (I) into the plasma

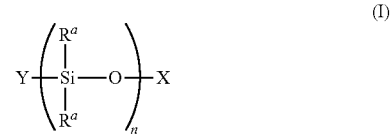

wherein
   X is —Si(R$^a$)3;
   Y is —OSi(R$^a$)3;
   each R$^a$ is independently H, OH, alkyl, aryl, or alkoxy; and
   n is an integer from 10 to 100;
   depositing a release layer attached to the substrate via covalent bonds, the release layer comprising a silicone containing polymer, the release layer being deposited on at least a portion of the first structured surface of the substrate to form the working mold.

2. The method according to claim 1, wherein the substrate is polymeric, metal, glass, ceramic, or semiconductive.

3. The method according to claim 1, wherein the substrate is polymeric.

4. The method according to claim 1, wherein each R$^a$ is —CH$_3$.

5. The method according to claim 1 further comprising introducing a secondary reactant into the chamber before or at substantially the same time as the liquid silicone vapor is introduced.

6. The method according to claim 5 wherein the secondary reactant comprises oxygen gas, Si(R$^a$)$_3$R$^b$ wherein R$^a$ is independently H, alkyl, or alkoxy; and R$^b$ is independently H, alkyl, alkoxy, —OSi(R$^a$)$_3$, or —Si(R$^a$)$_3$, where R$^a$ is as defined above, or a combination thereof.

7. The method according to claim 5, wherein the secondary reactant comprises oxygen gas or a hydrocarbon having 1 to 5 carbon atoms.

8. A method of forming a molded article comprising:
placing an untreated working mold near an electrode in a chamber, the untreated working mold having at least a first structured surface;
providing power to the electrode to create a plasma;
introducing vapor of liquid silicone molecules of Formula (I) into the plasma

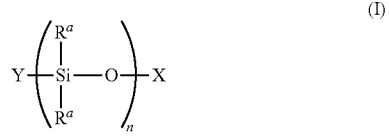

wherein
X is —Si(R$^a$)3;
Y is —OSi(R$^a$)3;
each R$^a$ is independently H, OH, alkyl, aryl, or alkoxy; and
n is an integer from 10 to 100;
depositing a release layer attached to the substrate via covalent bonds, the release layer comprising a silicone containing polymer, the release layer being deposited on at least a portion of the first structured surface to form the working mold; and
contacting a third generation precursor with at least a portion of the first surface of the working mold to form a molded article that is the inverse of the first structured surface of the working mold.

9. The method according to claim 8, wherein the third generation precursor comprises monomers.

10. The method according to claim 9, wherein the third generation precursor further comprises surfactant.

11. The method according to claim 9 further comprising polymerizing and crosslinking the monomers to form the molded article.

12. The method according to claim 9, wherein depositing the third generation precursor on at least the first structured surface of the working mold is done in a continuous fashion.

13. The method according to claim 8 further comprising forming a continuous tool comprising the working mold mounted on a rotating drum.

14. The method according to claim 13, wherein depositing the third generation precursor on at least the first structured surface of the working mold is done in a continuous fashion.

15. A method of continuously forming a molded article comprising:
placing an untreated working mold near an electrode in a chamber, the untreated working mold having at least a first structured surface;
providing power to the electrode to create a plasma;
introducing vapor of liquid silicone molecules of Formula (I) into the plasma

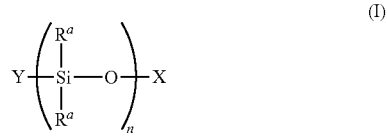

wherein
X is —Si(R$^a$)3;
Y is —OSi(R$^a$)3;
each R$^a$ is independently H, OH, alkyl, aryl, or alkoxy; and
n is an integer from 10 to 100;
depositing a release layer attached to the substrate via covalent bonds, the release layer comprising a silicone containing polymer, the release layer being deposited on at least a portion of the first structured surface to form the working mold;
forming a continuous tool comprising the working mold mounted on a rotating drum; and
continuously contacting a third generation precursor with at least a portion of the first surface of the working mold to form a molded article that is the inverse of the first structured surface of the working mold.

16. The method according to claim 15 further comprising continuously curing the third generation precursor.

* * * * *